(12) United States Patent
Miwa

(10) Patent No.: US 6,225,863 B1
(45) Date of Patent: *May 1, 2001

(54) OFFSET ADJUSTING APPARATUS FOR CANCELING OFFSET VOLTAGE GENERATED IN DIFFERENCE AMPLIFIER

(75) Inventor: Toshitsugu Miwa, Tokyo (JP)

(73) Assignee: Mitsubishi Denki Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/199,454

(22) Filed: Nov. 25, 1998

(30) Foreign Application Priority Data

Jun. 28, 1998 (JP) .................................................... 10-212611

(51) Int. Cl.[7] ................................. H03F 1/02; H03F 3/45; G11B 5/02; H03L 5/00
(52) U.S. Cl. ............................... 330/9; 327/307; 330/252; 330/257; 360/67
(58) Field of Search .................................. 330/9, 51, 252, 330/257; 360/67, 68; 327/307

(56) References Cited

U.S. PATENT DOCUMENTS 4,382,224 * 5/1983 Miller .................................... 323/269

FOREIGN PATENT DOCUMENTS

| 59-67704 | 4/1984 | (JP) . |
| 59-67705 | 4/1984 | (JP) . |
| 7-193442 | 7/1995 | (JP) . |
| 7193442 | 7/1995 | (JP) . |

OTHER PUBLICATIONS

Abstract only for JP1982000176574.

* cited by examiner

*Primary Examiner*—Michael B Shingleton
(74) *Attorney, Agent, or Firm*—Leydig, Voit & Mayer, Ltd.

(57) ABSTRACT

An offset adjusting apparatus includes transistor groups of transistors connected in parallel to each other. The transistor groups are connected in parallel to either a pair of transistors distributed on a first side of a differential head section and a current mirror section or a pair of transistors distributed on a second side of the differential head section and the current mirror section. The offset adjusting apparatus further includes a control circuit for controlling the turning on and turning off of each transistor of the transistor groups.

13 Claims, 5 Drawing Sheets

OFFSET ADJUSTING APPARATUS FOR CANCELING OFFSET VOLTAGE GENERATED IN DIFFERENCE AMPLIFIER

This application claims priority under 35 U.S.C. § 119 and/or § 365 to Hei 10-212611 filed in Japan on Jun. 28, 1998, the entire content of which is herein incorporated by reference.

BACKGROUND OF THE INVENTION

1. Field of the Invention

This invention relates to an offset adjusting apparatus for canceling an offset voltage generated in a difference amplifier.

2. Description of the Prior Art

Figure 5:
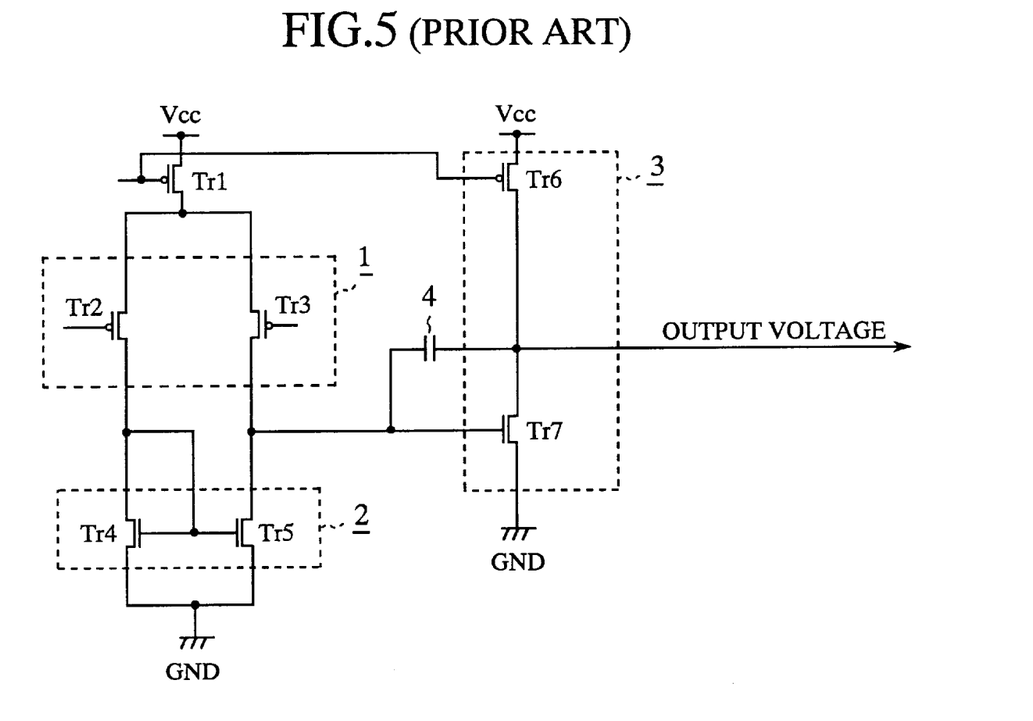
FIG. 5 is a circuit diagram showing an operational amplifier to which a conventional offset adjusting apparatus is applied.

FIG. 5 is a circuit diagram showing an operational amplifier to which a conventional offset adjusting apparatus is applied. In the figure, reference numeral 1 denotes a differential head section including a difference amplifier of the operational amplifier. Numeral 2 denotes a current mirror section including another difference amplifier of the operational amplifier. Numeral 3 denotes an output stage circuit of the operational amplifier. Numeral 4 denotes a capacitor for phase compensation.

Reference character Tr1 denotes a transistor for supplying a constant current. Characters Tr2 and Tr3 denote transistors of the differential head section 1. Characters Tr4 and Tr5 denote transistors of the current mirror section 2. Characters Tr6 and Tr7 denote transistors of composing the output stage circuit 3.

Figure 6:
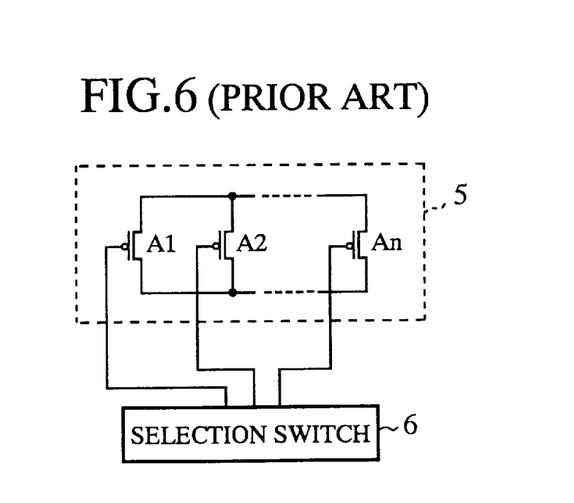
FIG. 6 is a circuit diagram showing a conventional offset adjusting apparatus.

FIG. 6 is a circuit diagram showing a conventional offset adjusting apparatus shown in, for example, JP-Sho. 59-67705. In the figure, reference numeral 5 denotes a transistor group for adjusting an offset voltage, including transistors A1–An connected in parallel to each other. Numeral 6 denotes a selection switch for controlling the turning on and off of the transistors A1–An.

Next, the operation of the prior art will be described.

If specific characteristics, such as a threshold voltage and variations in designed size, of the transistors Tr2 and Tr3, of the differential head section 1, completely accord with each other, and if specific characteristics of the transistors Tr4 and Tr5, of the current mirror section 2, completely accord with each other, an offset voltage generated in the operational amplifier is 0 mV under a condition that the resistance of wiring is distributed unsymmetrically in its layout.

However, it is actually almost impossible to produce those transistors so that the above-mentioned specific characteristics of the transistors are completely equal to each other and that the resistance of wiring is distributed completely unsymmetrically in a production process of a semiconductor integrated circuit using a wafer process. As a result, an offset voltage is usually generated.

Accordingly, when an offset voltage generated in an operational amplifier is required to be cancelled, conventionally, transistor groups 5 are connected in parallel to the transistors Tr4 and Tr5 in the current mirror section 2, respectively, and further the on-resistance of the transistor Tr4 or Tr5 is adjusted by switching the on-off states of transistors A1–An of the transistor groups 5 with the selection switch 6 for canceling the generated offset voltage.

That is, when the on-off states of the transistors A1–An are switched, the on-resistance of the transistor Tr4 or Tr5 is changed to vary the gate voltage of the transistor Tr7. As the on-resistance of the transistor Tr7 is varied consequently, the output voltage of the output stage circuit 3 can be adjusted.

Therefore, the offset voltage can be canceled by switching the on-off states of the transistors A1–An.

Because the conventional offset adjusting apparatus is constructed as above, the accuracy of cancellation of an offset voltage can be improved in the transistor groups 5 by connecting a lot of transistors having an appropriate size in parallel to each other. However, there is a problem that the layout size of the transistor groups 5 is large due to their large circuit scale in such cases where the gates of the transistors Tr4 and Tr5 are designed to be wide because their threshold voltages are low and where the transconductances of the transistors Tr4 and Tr5 are relatively small.

SUMMARY OF THE INVENTION

Accordingly, an object of the present invention is to obtain an offset adjusting apparatus that can improve the accuracy of cancellation of an offset voltage even if it is not appropriate to connect transistor groups including many transistors connected in parallel to each other, respectively, with a pair of transistors of a current mirror section, and that can increase the degree of freedom of designing the transistor groups so as to enable a circuit designer to design a circuit optimum in layout.

For attaining the above-mentioned object, according to a first aspect of the present invention, there is provided an offset adjusting apparatus comprising a plurality of transistor groups, which are composed of a plurality of transistors connected in parallel to each other, respectively, the plurality of transistor groups being connected in parallel to either a pair of transistors distributed on the left side of a differential head section and a current mirror section, or a pair of transistors distributed on their right side, wherein the offset adjusting apparatus controls the turning on and off of the transistors composing the plurality of transistor groups. Consequently, there can be obtained an advantage that the accuracy of cancellation of an offset voltage can be improved even if it is not appropriate to connect the plurality of transistor groups to the pair of transistors in the current mirror section from a viewpoint of, for example, the designing of circuit elements optimum in size, and an advantage that the degree of freedom of designing the plurality of transistor groups can be increased.

According to a second aspect of the invention, there is provided an offset adjusting apparatus comprising a plurality of transistor groups, which are composed of a plurality of transistors connected in parallel to each other, respectively, the plurality of transistor groups being connected in parallel to either a pair of transistors, one of which is distributed on the left side of a differential head section and the other of which is distributed on the right side of a current mirror section, or a pair of transistors distributed vice versa, wherein the offset adjusting apparatus controls the turning on and off of the transistors composing the plurality of transistor groups. Consequently, there can be obtained an advantage that the accuracy of cancellation of an offset voltage can be improved even if it is not appropriate to connect the plurality of transistor groups to the pair of transistors in the current mirror section from a viewpoint of, for example, the designing of circuit elements optimum in size, and an advantage that the degree of freedom of designing the plurality of transistor groups can be increased.

According to a third aspect of the invention, there is provided an offset adjusting apparatus comprising a plurality of transistor groups, which are composed of a plurality of transistors connected in parallel to each other, respectively, the plurality of transistor groups being connected in parallel to any one of transistors composing a differential head section or a current mirror section, wherein the offset adjusting apparatus controls the turning on and off of the transistors constituting the plurality of transistor groups. Consequently, there can be obtained an advantage that the accuracy of cancellation of an offset voltage can be improved even if it is not appropriate to connect the plurality of transistor groups to the pair of transistors in the current mirror section from a viewpoint of, for example, the designing of circuit elements optimum in size, and an advantage that the degree of freedom of designing the plurality of transistor groups can be increased.

According to a fourth aspect of the invention, there is provided an offset adjusting apparatus comprising a control circuit controlling the turning on and off of the transistors composing a plurality of transistor groups on the basis of data indicating an offset cancellation quantity. Consequently, there can be obtained an advantage that an offset voltage can be adjusted only by giving the data indicating an offset cancellation quantity to the control circuit.

According to a fifth aspect of the invention, there is provided an offset adjusting apparatus wherein wiring on the drain side or the source side of transistors composing a plurality of transistor groups is to be cut for adjusting an offset voltage. Consequently, there can be obtained an advantage that an offset voltage can be adjusted without distributing a control circuit.

According to a sixth aspect of the invention, there is provided an offset adjusting apparatus wherein a plurality of transistor groups are disposed in parallel without being wired to transistors composing a differential head section or a current mirror section. Consequently, there can be obtained an advantage that an offset voltage can be adjusted without distributing a control circuit.

BRIEF DESCRIPTION OF THE DRAWINGS

Further objects and advantages of the present invention can be more fully understood from the following detailed description taken in conjunction with the accompanying drawings in which.

DETAILED DESCRIPTION OF THE PREFERRED EMBODIMENTS

Preferred embodiments of the present invention will hereinafter be described in detail with the drawings.

Embodiment 1

Figure 1:
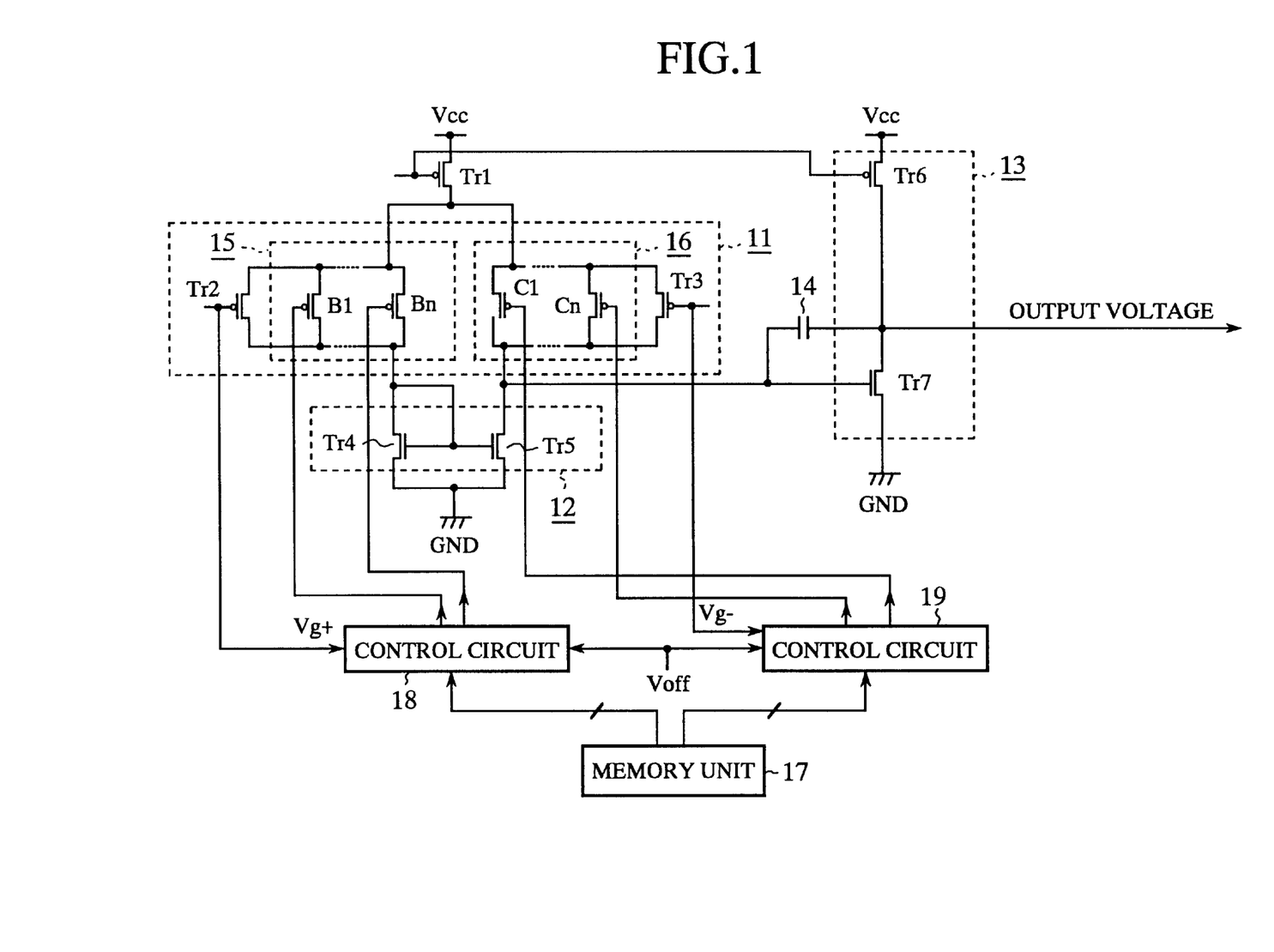
FIG. 1 is a circuit diagram showing an offset adjusting apparatus according to a first embodiment (Embodiment 1) of the present invention.

FIG. 1 is a circuit diagram showing an offset adjusting apparatus according to Embodiment 1 of the invention. In the figure, reference numeral 11 denotes a differential head section of a difference amplifier of an operational amplifier. Numeral 12 denotes a current mirror section of another difference amplifier of the operational amplifier. Numeral 13 denotes an output stage circuit of the operational amplifier. Numeral 14 denotes a capacitor for phase compensation.

Reference character Tr1 denotes a transistor for supplying a constant current. Characters Tr2 and Tr3 denote transistors of the differential head section 11. Characters Tr4 and Tr5 denote transistors of the current mirror section 12. Characters Tr6 and Tr7 denote transistors of the output stage circuit 13.

Furthermore, reference numeral 15 denotes a transistor group connected in parallel to the transistor Tr2 in the differential head section 11; the transistor group 15 includes n (n is a natural number) transistors B1–Bn connected in parallel to each other. Numeral 16 denotes a transistor group connected in parallel to the transistor Tr3 in the differential head section 11; the transistor group 16 includes n transistors C1–Cn connected in parallel. Numeral 17 denotes a memory unit for storing data indicating an offset cancellation quantity. Numeral 18 denotes a control circuit controlling the turning on and off of the transistors B1–Bn on the basis of the data stored in the memory unit 17. Numeral 19 denotes a control circuit controlling the turning on and off of the transistors C1–Cn on the basis of the data stored in the memory unit 17.

Next, the operation of the Embodiment 1 will be described.

At first, it should be noted that the transistor groups 15 and 16, including a plurality of transistors connected in parallel to each other, respectively, may be connected to the transistors Tr4 and Tr5 in the current mirror section 12 identically to the conventional structure for the cancellation of an offset voltage generated in an operational amplifier, instead of being connected to the transistors Tr2 and Tr3 in the differential head section 11 as in this Embodiment 1.

That is, there is a case where it is convenient for a circuit designer to connect the transistor groups 15 and 16 to the transistors Tr2 and Tr3 in the differential head section 11 from the viewpoint of the design of circuit elements optimal in size. On the other hand, there is another case where it is convenient for the designer to connect the transistor groups 15 and 16 to the transistors Tr4 and Tr5 in the current mirror section 12. Accordingly, the designer may connect the transistor groups 15 and 16 to either the transistors Tr2 and Tr3 in the differential head section 11 or the transistors Tr4 and Tr5 in the current mirror section 12 as occasion demands.

In Embodiment 1, as described above, the transistor groups 15 and 16 are connected to the transistors Tr2 and Tr3 in the differential head section 11; the transistors B1–Bn and C1–Cn, each are part of the transistor groups 15 and 16, respectively, are set in the on-state in their initial state (or before adjusting an offset voltage).

Then, the adjustment of an offset voltage is executed on the basis of the data which is stored in the memory unit 17, indicating an offset cancellation quantity, when an offset voltage is actually adjusted. The control circuit 18 holds the on-state of the transistor B1, for example, when the data corresponding to the transistor B1 is "1"; the control circuit 18 turns the transistor B1 off when the data is "0". The control circuit 18 holds the on-state of the transistor Bn, likewise, when the data corresponding to the transistor Bn is "1"; the control circuit 18 turns the transistor Bn off when the data is "0".

By turning off any of transistors of the transistor group 15 for adjusting the offset voltage, the on-resistance of the transistor Tr2 (or the combined on-resistance of the transistor Tr2 and the transistor group 15) increases in comparison with its initial state, lowering the gate voltage of the transistor Tr5. Consequently, the on-resistance of the transistor Tr5 increases to raise the gate voltage of the transistor Tr7. The on-resistance of the transistor Tr7 decreases consequently to vary the output voltage of the output stage circuit 13 toward the lower voltage side.

On the other hand, the control circuit 19 holds the on-state of the transistor C1, for example, when the data corresponding to the transistor C1 is "1"; the control circuit 19 turns the transistor C1 off when the data is "0". The control circuit 19 holds the on-state of the transistor Cn, likewise, when the data corresponding to the transistor Cn is "1"; the control circuit 19 turns the transistor Cn off when the data is "0".

By turning off any of transistors of the transistor group 16 for adjusting the offset voltage, the on-resistance of the transistor Tr3 (or the combined on-resistance of the transistor Tr3 and the transistor group 16) increases in comparison with its initial state, lowering the gate voltage of the transistor Tr7. Consequently, the on-resistance of the transistor Tr7 increases to vary the output voltage of the output stage circuit 13 toward the higher voltage side.

With this configuration, the output voltage of the output stage circuit 13 can be shifted towards the lower voltage side by turning off the transistors B1–Bn of the transistor group 15. Accordingly, an offset voltage on the positive voltage side can be cancelled by turning off any of the transistors B1–Bn.

On the other hand, the output voltage of the output stage circuit 13 can be shifted toward the higher voltage side by turning off the transistors C1–Cn of the transistor group 16. Accordingly, an offset voltage on the negative voltage side can be cancelled by turning off any of the transistors C1–Cn.

As apparent from the above discussion, according to the Embodiment 1, an offset adjusting apparatus including the transistor groups 15 and 16 connected in parallel to either the transistors Tr2 and Tr3 in the differential head section 11 or the transistors Tr4 and Tr5 in the current mirror section 12, wherein the offset adjusting apparatus controls the turning on and off of the transistors B1–Bn and C1–Cn of the transistor groups 15 and 16, respectively. Consequently, even if it is not suitable from, for example, the viewpoint of designing circuit elements optimal in size to connect the transistor groups 15 and 16 to the transistors Tr4 and Tr5 in the current mirror section 12, there can be obtained an advantage that the cancellation accuracy of an offset voltage can be improved, and an advantage that the degree of freedom of designing the transistor groups 15 and 16 is increased.

Embodiment 2

Figure 2:
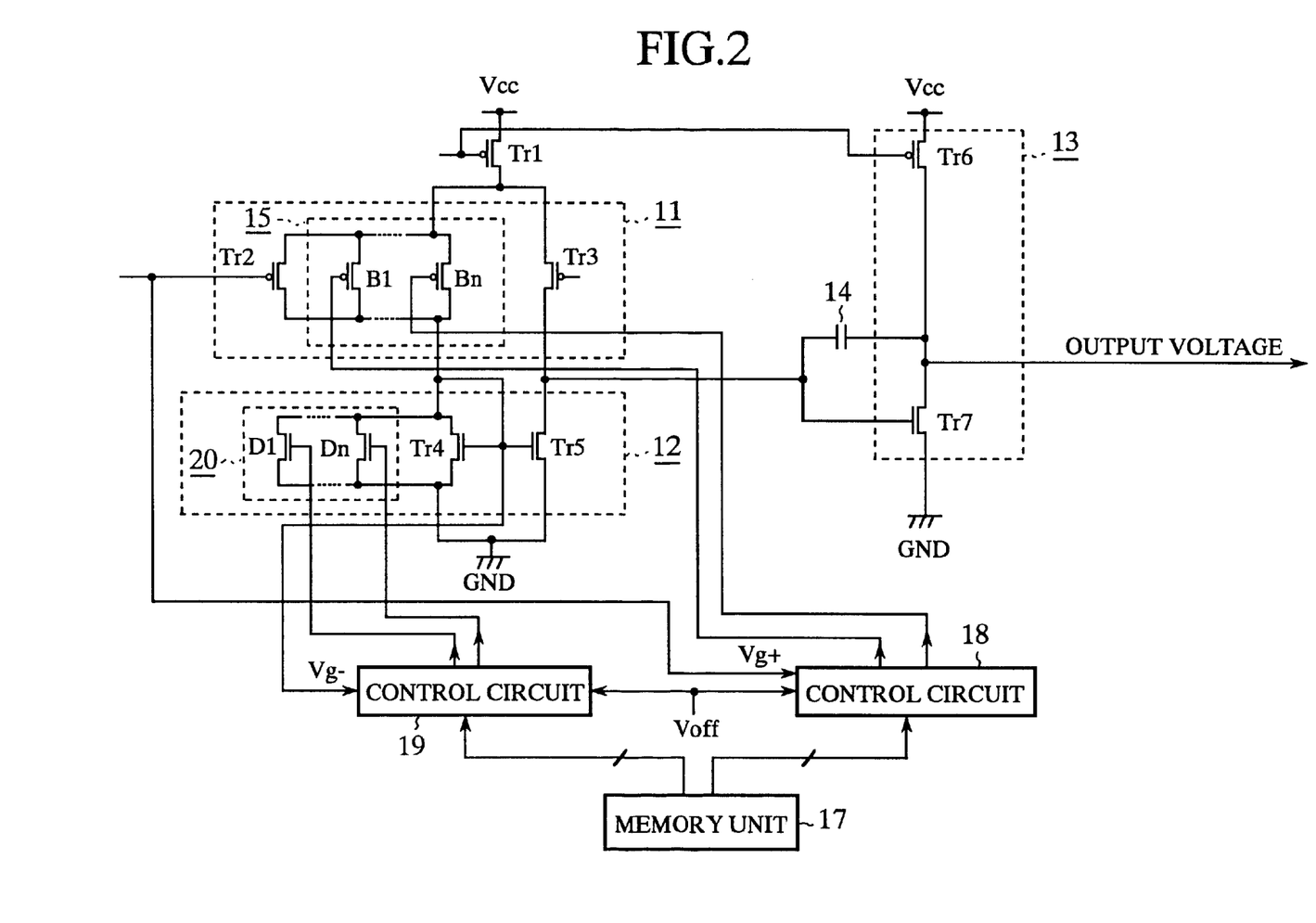
FIG. 2 is a circuit diagram showing an offset adjusting apparatus according to a second embodiment (Embodiment 2) of the present invention.

FIG. 2 is a circuit diagram showing an offset adjusting apparatus according to Embodiment 2. In the figure, the same reference characters as those shown in FIG. 1 indicate the same or corresponding elements as those shown in FIG. 1. A description concerning such elements is omitted.

Reference numeral 20 denotes a transistor group connected in parallel to the transistor Tr4 in the current mirror section 12. The transistor group 20 includes n transistors D1–Dn connected in parallel to each other.

Next, the operation of the Embodiment 2 will be described.

In Embodiment 1, the transistor groups 15 and 16 are connected to the transistors Tr2 and Tr3 in the differential head section 11 or the transistors Tr4 and Tr5 in the current mirror section 12. The transistor group 15(16), 20 may be connected to either the transistors Tr2 and Tr4 on the left side of the differential head section 11 and the current mirror section 12, respectively, or the transistors Tr3 and Tr5 on the right side of the differential head section 11 and the current mirror section 12, respectively. FIG. 2 shows the case where the transistor groups 15 and 20 are connected to the transistors Tr2 and Tr4, respectively. There can be also obtained advantages similar to those of Embodiment 1 by connecting the transistor groups 15(16) and 20 as above.

The control circuit 19 holds the on-state of the transistor D1, for example, when the data corresponding to the transistor D1 is "1"; the control circuit 19 turns the transistor D1 off when the data is "0". The control circuit 19 holds the on-state of the transistor Dn, likewise, when the data corresponding to the transistor Dn is "1"; the control circuit 19 turns the transistor Dn off when the data is "0".

By turning any of transistors D1–Dn off for adjusting an offset voltage, the on-resistance of the transistor Tr4 (or the combined on-resistance of the transistor Tr4 and the transistor group 20) increases in comparison with its initial state, raising the gate voltage of the transistor Tr5. Consequently, the on-resistance of the transistor Tr5 decreases, lowering the gate voltage of the transistor Tr7. As a result, the on-resistance of the transistor Tr7 increases to vary the output voltage of the output stage circuit 13 to the higher voltage side.

When any of the transistors B1–Bn is turned off, the on-resistance of the transistor Tr2 (or the combined on-resistance of the transistor Tr2 and the transistor group 15) increases, lowering the gate voltage of the transistor Tr5. The on-resistance of the transistor Tr5 increases, consequently raising the gate voltage of the transistor Tr7. As a result, the on-resistance of the transistor Tr7 decreases, varying the output voltage of the output stage circuit 13 toward the lower voltage side.

With this configuration, the output voltage of the output stage circuit 13 can be shifted toward the lower voltage side by turning off the transistors B1–Bn of the transistor group 15 off. The output voltage of the output stage circuit 13 can be shifted toward the higher voltage side by turning off the transistors DI-Dn of the transistor group 20. Accordingly, an offset voltage can be cancelled by turning any of the transistors B1–Bn off when the offset voltage is generated on the positive side, and by turning any of the transistors D1–Dn off when the offset voltage is generated on the negative side.

We omit the detailed description here about the case where the transistor groups 16 and 20 are connected to the transistors Tr3 and Tr5 distributed on the right side of the differential head section 11 and the current mirror section 12. By turning off any of the transistors of the transistor group 20 for the adjustment of an offset voltage, the on-resistance of the transistor Tr5 (or the combined on-resistance of the transistor Tr5 and the transistor group 20) increases in comparison with its initial state, raising the gate voltage of the transistor Tr7. Consequently, the on-resistance of the transistor Tr7 decreases, varying the output voltage of the output stage circuit 13 toward the lower voltage side.

Furthermore, by turning off any of the transistors of the transistor group 16, the on-resistance of the transistor Tr3 (or the combined on-resistance of the transistor Tr3 and the transistor group 16) increases in comparison with its initial state, lowering the gate voltage of the transistor Tr7. Consequently, the on-resistance of the transistor Tr7 increases, varying the output voltage of the output stage circuit 13 toward the higher voltage side.

Embodiment 3

The offset adjusting apparatus according to Embodiment 1 and Embodiment 2 were shown to set the initial states of the transistors composing the transistor groups 15, 16 and 20 in the on-state. However, the initial states may be set to the off-state and turned to the on-state for adjusting an offset voltage. Even if the initial states are set as above, advantages similar to those of the Embodiment 1 and 2 can be obtained.

In this case, the transistor group 15 connected to the transistor Tr2 in the differential head section 11 shifts the output voltage of the output stage circuit 13 toward the higher voltage side for adjusting an offset voltage conversely to Embodiment 1.

The transistor group 16 connected to the transistor Tr3 in the differential head section 11 shifts the output voltage of the output stage circuit 13 toward the lower voltage side for adjusting an offset voltage conversely to Embodiment 1.

Furthermore, the transistor group 20 connected to the transistor Tr4 in the current mirror section 12 shifts the output voltage of the output stage circuit 13 toward the lower voltage side for adjusting an offset voltage conversely to Embodiment 2.

If the transistor group 20 is connected to the transistor Tr5 in the current mirror section 12, the transistor group 20 shifts the output voltage of the output stage 13 toward the higher voltage side for adjusting an offset voltage conversely to Embodiment 2.

Embodiment 4

Figure 3:
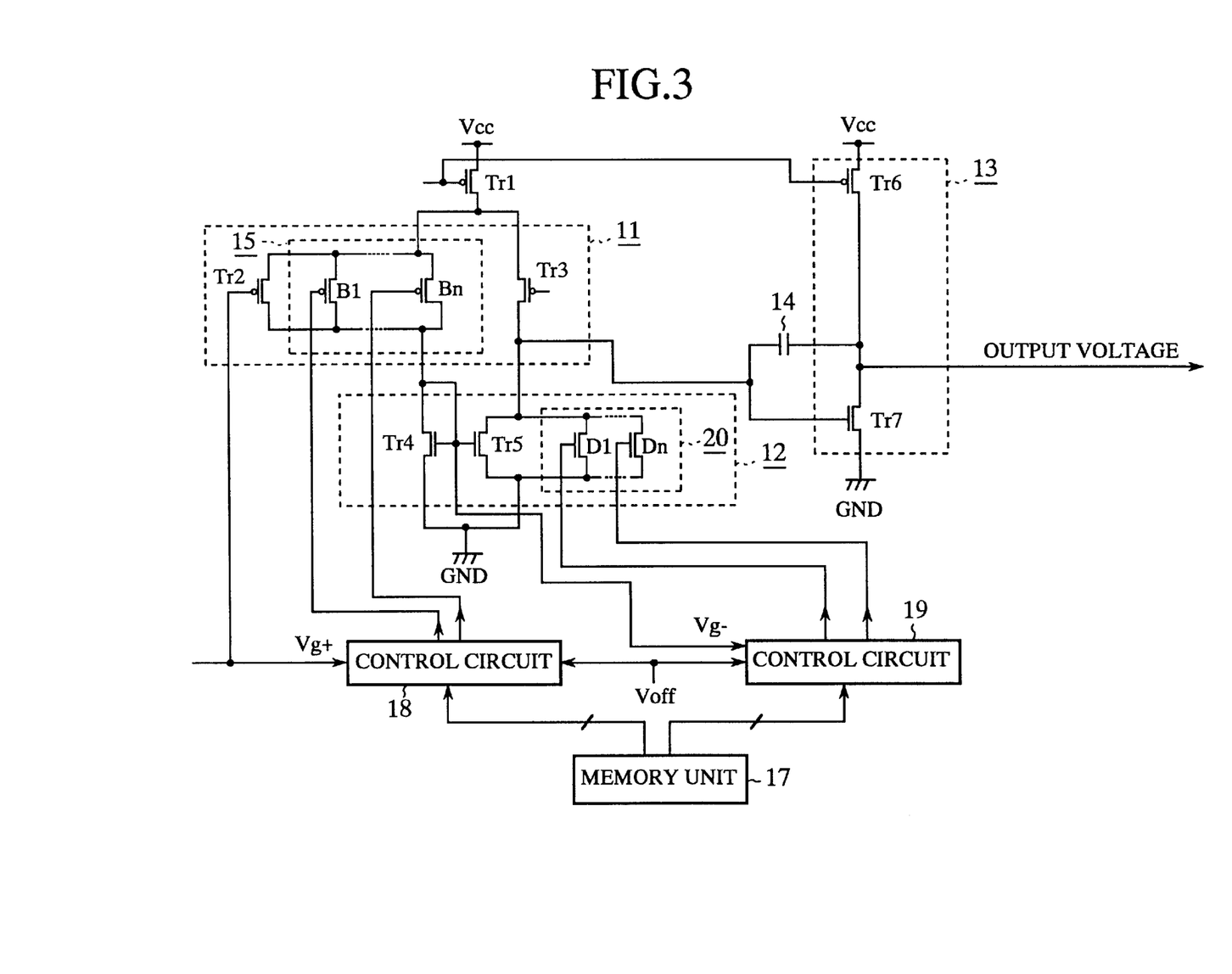
FIG. 3 is a circuit diagram showing an offset adjusting apparatus according to a fourth embodiment (Embodiment 4) of the present invention.

The offset adjusting apparatus in which the transistor groups 15 and 16 are connected in parallel to either the transistors Tr2 and Tr3 in the differential head section 11 or the transistors Tr4 and Tr5 in the current mirror section 12 was discussed for Embodiment 1. As shown in FIG. 3, the transistor groups 15 and 20 may be connected in parallel to the transistor Tr2 in the differential head section 11 and the transistor Tr5 in the current mirror section 12, respectively.

Such a connection of the transistor groups 15 and 20 can derive advantages similar to those of Embodiment 1. If the initial states of the transistors B1–Bn of the transistor group 15 are set in the on-state, namely in the case where the output voltage of the output stage circuit 13 is to be shifted toward the lower voltage side by the transistor group 15, it is required to shift the output voltage of the output stage circuit 13 toward the higher voltage side by the transistor group 20. That is, it is required to set the initial states of the transistors D1–Dn of the transistor group 20 in the off-state. On the other hand, if the initial states of transistors B1–Bn of the transistor group 15 are set to the off-state, namely in the case where the output voltage of the output stage circuit 13 is shifted toward the higher voltage side by the transistor group 15, it is required to shift the output voltage of the output stage circuit 13 to the lower voltage side by the transistor group 20. That is, it is required to set the initial states of the transistors D1–Dn comprising the transistor group 20 to the on-state.

Embodiment 5

The offset adjusting apparatus, wherein the transistor group 15 is connected in parallel to the transistor Tr2 in the differential head section 11 and the transistor group 20 is connected in parallel to the transistor Tr5 in the current mirror section 12, was described for Embodiment 4. The transistor group 16 and 20 may be connected in parallel to the transistor Tr3 in the differential head section 11 and the transistor Tr4 in the current mirror section 12, respectively.

With such a configuration, there can be obtained advantages similar to those of Embodiment 4. When the initial states of the transistors C1–Cn constituting the transistor group 16 are set to the on-state, namely when the output voltage of the output stage circuit 13 is shifted toward the higher voltage side by the transistor group 16, it is required to shift the output voltage of the output stage circuit 13 toward the lower voltage side with the transistor group 20. Consequently, it is required to set the initial states of the transistors D1–Dn of the transistor group 20 to the off-state. On the other hand, when the initial states of the transistors C1–Cn of the transistor group 16 are set to the off-state, namely when the output voltage of the output stage circuit 13 is shifted toward the lower voltage side by the transistor group 16, it is required to shift the output voltage of the output stage circuit 13 toward the higher voltage side with the transistor group 20. Consequently, it is necessary to set the initial states of the transistors D1–Dn of the transistor group 20 to the on-state.

Embodiment 6

Figure 4:
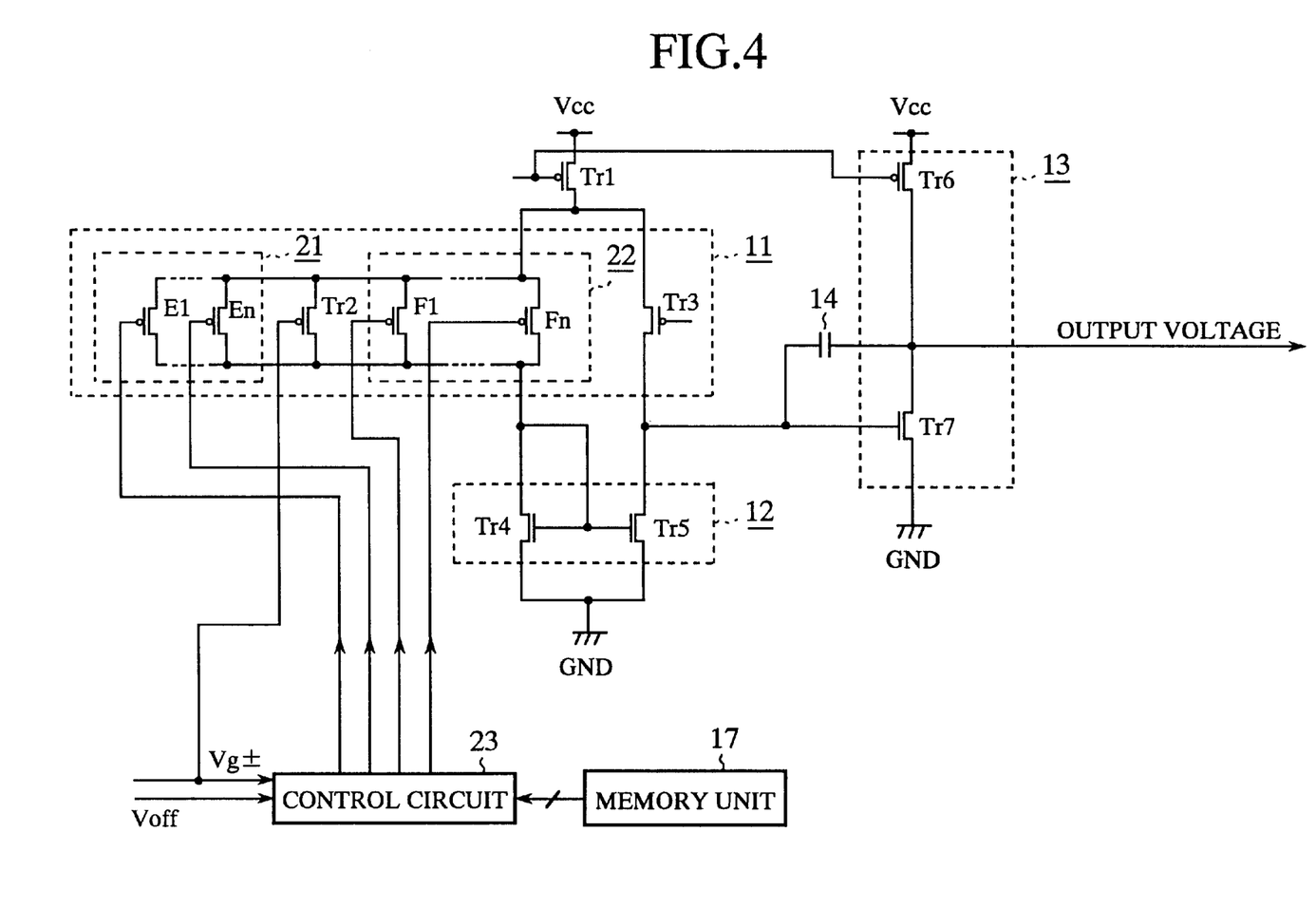
FIG. 4 is a circuit diagram showing an offset adjusting apparatus according to a sixth embodiment (Embodiment 6) of the present invention.

FIG. 4 is a circuit diagram showing an offset adjusting apparatus according to Embodiment 6 of the present invention. In the figure, the same reference characters as those of FIG. 1 indicate the same or corresponding elements as those shown in FIG. 1. A description concerning such elements is omitted.

Reference numeral 21 denotes a transistor group connected in parallel to the transistor Tr2 in the differential head section 11; the transistor group 21 includes n transistors E1–En connected in parallel to each other. Numeral 22 denotes a transistor group connected in parallel to the transistor Tr2 in the differential head section 11; the transistor group 22 includes n transistors F1–Fn connected in parallel to each other. Numeral 23 denotes a control circuit controlling the turning on and off of the transistors E1–En and F1–Fn on the basis of the data stored in the memory unit 17.

Next, the operation of Embodiment 6 will be described.

There are shown in Embodiment 1 to Embodiment 5 offset adjusting apparatus wherein transistor groups are connected to two arbitrary transistors among the transistors Tr2–Tr5. The transistor groups 21 and 22 may be connected to one arbitrary transistor among the transistors Tr2–Tr5.

With such a configuration, there can be obtained advantages similar to those of the Embodiments 1–5. When the initial states of the transistors E1–En of the transistor group 21 are set to the off state, namely when the output voltage of the output stage circuit 13 is shifted toward the higher voltage side by the transistor group 21, it is required to shift the output voltage of the output stage circuit 13 toward the lower voltage side with the transistor group 22. Consequently, it is required to set the initial states of the transistors F1–Fn comprising the transistor group 22 to the on-state. On the other hand, when the initial states of the transistors E1–En of the transistor group 21 are set to the on-state, namely when the output voltage of the output stage circuit 13 is shifted toward the lower voltage side, it is necessary to shift the output voltage of the output stage circuit 13 toward the higher voltage side with the transistor group 22. Consequently, the initial states of the transistors F1–Fn of the transistor group 22 is required to be the off-state.

Embodiment 7

There are shown in the Embodiments 1 and 2 offset adjusting apparatus comprising the memory unit 17 and the control circuits 18 and 19, wherein the control circuits 18 and 19 switch the transistors B1 and so on of the transistor groups 15, 16 and 20 from the on-state to the off-state. It is applicable to cut off the wiring on the drain side or the source side of the transistors B1 and of the transistor groups 15, 16 and 20 for cutting off the transistors B1 and so on, namely for bringing them to a state to be switched to the off-state.

By performing such an operation, there can be obtained an advantage that an offset voltage can be adjusted without distributing the memory unit 17 and the control circuits 18 and 19.

Embodiment 8

There is shown in Embodiment 3 an offset adjusting apparatus comprising the memory unit 17 and the control circuits 18 and 19, wherein the control circuits 18 and 19 switch the transistors B1 and so on of the transistor groups 15, 16 and 20 from the off-state to the on-state. It is applicable to dispose the transistors B1 and so on of the transistor groups 15, 16 and 20 without wiring to the transistors Tr2 etc. of the differential head section 11 or the current mirror section 12 initially, and then to connect the transistors B1 and so on in parallel to the transistors Tr2 etc. by, for example, Focused Ion Beam (FIB) processing when an offset voltage is adjusted.

With such processing, there can be obtained an advantage that an offset voltage can be adjusted without distributing the memory unit 17 and the control circuits 18 and 19.

Embodiment 9

There are shown in the Embodiments 4–6 offset adjusting apparatus wherein a transistor group of the transistors, the initial states of which are set to the on-state, is intermingled with a transistor group of the transistors, the initial states of which are set to the off-state. The transistors the initial states of which are set to the on-state may be formed so that their wiring on their drain side or their source side is to be disconnected when an offset voltage is adjusted as shown in Embodiment 7. The transistors, the initial states of which are set to the off-state, may be formed so that they are to be wired to the transistors Tr2 and so on by FIB processing as in the Embodiment 8.

With such processing, there can be obtained an advantage that an offset voltage can be adjusted without distributing the memory unit 17 and the control circuits 18 and 19.

While the present invention, as to its objects and advantages, has been described herein as carried out in specific embodiments, it is not desired to be limited thereby but it is intended to cover the invention broadly within the spirit and scope of the appended claims.

What is claimed is:

1. An offset adjusting apparatus for adjusting an offset voltage generated in a differential amplifier including a differential head section and a current mirror section, the differential head section including first and second transistors, the current mirror section including third and fourth transistors having respective sources, gates, and drains, the third and fourth transistors being connected to the first and second transistors, respectively, the gate and drain of one of the third and fourth transistors being short-circuited to each other, the offset adjusting apparatus comprising:

a plurality of first offset adjusting transistors connected in parallel with each other and the first transistor and connected in series with the third transistor; and a first control circuit for controlling turning on and turning off each of the first offset adjusting transistors.

2. The offset adjusting apparatus according to claim 1 comprising a memory for storing data indicating an offset cancellation quantity, the control circuit controlling turning on and turning off of the first offset adjusting transistors in accordance with the data stored in the memory.

3. The offset adjusting apparatus according to claim 1 including:

a plurality of second offset adjusting transistors connected in parallel with each other and the second transistor; and a second control circuit for turning on and turning off each of the second offset adjusting transistors.

4. The offset adjusting apparatus according to claim 3 wherein the plurality of second offset adjusting transistors are connected in series with the fourth transistor.

5. The offset adjusting apparatus according to claim 3 comprising a memory for storing first and second data respectively indicating offset cancellation quantities, the first and second control circuits controlling turning on and turning off of each of the first and second offset adjusting transistors in accordance with the first and second data, respectively, stored in the memory.

6. The offset adjusting apparatus according to claim 1 comprising:

a plurality of second offset adjusting transistors connected in parallel with each other and the third transistor; and a second control circuit for controlling turning on and turning off each of the second offset adjusting transistors.

7. The offset adjusting apparatus according to claim 6 comprising a memory for storing first and second data respectively indicating offset cancellation quantities, the first and second control circuits controlling turning on and turning off of each of the first and second offset adjusting transistors in accordance with the first and second data, respectively, stored in the memory.

8. The offset adjusting apparatus according to claim 1 comprising:

a plurality of second offset adjusting transistors connected in parallel with each other and the fourth transistor; and a second control circuit for controlling turning on and turning off each of the second offset adjusting transistors.

9. The offset adjusting apparatus according to claim 8 wherein the plurality of second offset adjusting transistors are connected in series with the second transistor.

10. The offset adjusting apparatus according to claim 8 comprising a memory for storing first and second data respectively indicating offset cancellation quantities, the first and second control circuits controlling turning on and turning off of each of the first and second offset adjusting transistors in accordance with the first and second data, respectively, stored in the memory.

11. An offset adjusting method for adjusting an offset voltage generated in a differential amplifier including a differential head section and a current mirror section, the differential head section having first and second transistors, the current mirror section having third and fourth transistors having respective sources, gates, and drains, the third and fourth transistors being connected to the first and second transistors, respectively, the gate and drain of one of the third and fourth transistors being short-circuited to each other, the method comprising:

connecting a plurality of offset adjusting transistors in parallel with each other and the first transistor of the differential head section with wirings, and cutting the wiring on either a drain or a source of at least one of the offset adjusting transistors to adjust an offset voltage.

12. An offset adjusting method for adjusting an offset voltage generated in a differential amplifier including a differential head section and a current mirror section, the differential head section having first and second transistors, the current mirror section having third and fourth transistors having respective sources, gates, and drains, the third and fourth transistors being connected to the first and second transistors, respectively, the gate and drain of one of the third and fourth transistors being short-circuited to each other, the method comprising:

providing a plurality of offset adjusting transistors without wirings connected to the first transistor, and connecting at least one of the offset adjusting transistors in parallel with the first transistor to adjust an offset voltage.

13. The method of claim 12 including connecting at least one of the offset adjusting transistors in a focused ion beam process.

* * * * *

UNITED STATES PATENT AND TRADEMARK OFFICE
CERTIFICATE OF CORRECTION

PATENT NO. : 6,225,863 B1
DATED : May 1, 2001
INVENTOR(S) : Toshitsugu Miwa

It is certified that error appears in the above-identified patent and that said Letters Patent is hereby corrected as shown below:

Title page,
Item [30], Foreign Application Priority Data,
-- July 28, 1998  [JP]          10-212611 --

Signed and Sealed this

Nineteenth Day of February, 2002

Attest:

JAMES E. ROGAN
*Attesting Officer*    *Director of the United States Patent and Trademark Office*